(12) United States Patent
Chang et al.

(10) Patent No.: US 9,247,615 B2
(45) Date of Patent: Jan. 26, 2016

(54) DISPLAY PANEL

(71) Applicant: E Ink Holdings Inc., Hsinchu (TW)

(72) Inventors: Shu-Hao Chang, Hsinchu (TW);
Chi-Ming Wu, Hsinchu (TW); Ian French, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 100 days.

(21) Appl. No.: 13/733,897

(22) Filed: Jan. 4, 2013

(65) Prior Publication Data

US 2013/0181605 A1 Jul. 18, 2013

Related U.S. Application Data

(60) Provisional application No. 61/587,643, filed on Jan. 17, 2012.

(30) Foreign Application Priority Data

Jul. 3, 2012 (TW) .............................. 101123897 A

(51) Int. Cl.
*G02F 1/1343* (2006.01)
*H05B 37/00* (2006.01)
(Continued)

(52) U.S. Cl.
CPC .............. *H05B 37/00* (2013.01); *G02F 1/1343* (2013.01); *G02F 1/1345* (2013.01); *H01L 27/3276* (2013.01); *G02F 2001/13456* (2013.01); *G09G 2300/0426* (2013.01)

(58) Field of Classification Search
CPC ....... G02F 1/1343; G02F 1/1345; G09G 5/00; H01J 9/24

USPC .............. 345/87, 102, 173, 204, 211; 349/40, 349/143, 139; 445/24
See application file for complete search history.

(56) References Cited

U.S. PATENT DOCUMENTS 5,956,009 A 9/1999 Zhang et al.
7,335,977 B2 2/2008 Tsukiji
(Continued)

FOREIGN PATENT DOCUMENTS

| CN | 1719602 A | 1/2006 |
|---|---|---|
| CN | 101587266 A | 11/2009 |

(Continued)

OTHER PUBLICATIONS

Corresponding TW Office Action that the art references were cited.
(Continued)

*Primary Examiner* — Nicholas Lee
*Assistant Examiner* — Abdul-Samad A Adediran
(74) *Attorney, Agent, or Firm* — CKC & Partners Co., Ltd.

(57) ABSTRACT

A display panel includes a substrate, a plurality of first signal lines, a plurality of second signal lines, a plurality of pixel units, a plurality of transmitting lines, and a driving chip. The transmitting lines are disposed on the substrate and electrically connected to the second signal lines. The driving chip includes a plurality of first pins, a plurality of second pins, and a driving circuit. The first pins are electrically connected to the first signal lines, and the second pins are electrically connected to the transmitting lines. The first pins and the second pins are disposed alternately and evenly, such that the first signal lines and the transmitting lines do not intersect each other. The transmitting lines are disposed on the substrate evenly.

10 Claims, 6 Drawing Sheets

(51) Int. Cl.
*H01L 27/32* (2006.01)
*G02F 1/1345* (2006.01)

(56) References Cited

U.S. PATENT DOCUMENTS

| | | | |
|---|---|---|---|
| 2005/0007534 A1* | 1/2005 | Kim | 349/139 |
| 2010/0066967 A1* | 3/2010 | Takahashi et al. | 349/143 |
| 2010/0110058 A1* | 5/2010 | Moh et al. | 345/211 |
| 2010/0273386 A1* | 10/2010 | Higuchi et al. | 445/24 |
| 2011/0080388 A1 | 4/2011 | Lo et al. | |

FOREIGN PATENT DOCUMENTS

| | | |
|---|---|---|
| CN | 101727866 A | 6/2010 |
| TW | M371907 | 1/2010 |
| TW | 201113613 A | 4/2011 |

OTHER PUBLICATIONS

Corresponding Chinese Office Action that these art references were cited.

* cited by examiner

DISPLAY PANEL

RELATED APPLICATIONS

This application claims priority to U.S. Provisional Application Ser. No. 61/587,643, filed Jan. 17, 2012, and Taiwan Application Serial Number 101123897, filed Jul. 3, 2012, the disclosures of which are incorporated herein by reference in their entireties.

BACKGROUND

1. Field of Invention

The present disclosure relates to display technology. More particularly, the present invention relates to a display panel.

2. Description of Related Art

With advances in display technology, display panels have been used in various different electronic products, such as cell phones, tablet computers, and digital cameras.

A display panel typically has a scan IC chip and a data IC chip disposed respectively to two sides of an active area. Wiring lines are disposed around the active area for providing signals to scan lines and data lines orthogonal to the scan lines. With such a configuration, a sufficient space is necessary around the active area to place the scan IC chip, the data IC chip, and the wiring lines. However, it is difficult to realize a display panel with thin borders with such a traditional approach, and this runs counter to trends of making electronic devices increasingly thinner, lighter and smaller.

Therefore, in order to allow for more widespread use of display panels, the aforementioned problem must be solved.

SUMMARY

One aspect of the present invention is a display panel. In accordance with one embodiment of the present invention, the display panel includes a substrate, a plurality of first signal lines, a plurality of second signal lines, a plurality of pixel units, a plurality of transmission lines, and a driver IC chip. The substrate includes an active area, in which the active area includes a plurality of pixel blocks. The first signal lines are disposed parallel to each other on the substrate. The second signal lines are disposed parallel to each other on the substrate, and crossing over the first signal lines to define the pixel blocks, in which there are more of the second signal lines than the first signal lines. The pixel units are respectively disposed within the pixel blocks, and respectively electrically connected to the first signal lines and respectively electrically connected to the second signal lines. The transmission lines are disposed parallel to each other on the substrate, respectively electrically connected to the second signal lines, crossing two opposite sides of the active area, and parallel to the first signal lines. The driver IC chip includes a plurality of first pins, a plurality of second pins, and a driver circuit. The first pins are electrically connected to the first signal lines. The second pins are electrically connected to the transmission lines. The driver circuit is configured to generate a first signal and a second signal, and to respectively transmit the first signal and the second signal to the first pins and the second pins. The first pins and the second pins are evenly disposed and interleaved with each other, such that the first signal lines and the transmission lines electrically connected to the first pins and the second pins do not cross over each other, and the transmission lines are evenly disposed on the substrate.

In accordance with one embodiment of the present invention, the display panel includes a plurality of dummy lines. The dummy lines are evenly disposed on the substrate, parallel to the transmission lines and crossing the two opposite sides of the active area. The transmission lines are divided into a to plurality of first transmission lines and a plurality of second transmission lines. The quantity of the first transmission lines passing through each pixel block is the same. Each pixel block is passed through by one of the second transmission lines or one of the dummy lines.

In accordance with one embodiment of the present invention, the display panel further includes a periphery circuit and a control circuit. The periphery circuit is disposed on the substrate and around the active area, and configured to electrically connect the dummy lines to each other. The control circuit is electrically connected to the periphery circuit and the driver IC chip, and configured to provide a turn-off voltage level to the periphery circuit, and to drive the driver IC chip.

In accordance with one embodiment of the present invention, the orthogonal projections of the dummy lines, the first transmission lines, the second transmission lines, and the first signal lines on the substrate are not overlapped.

In accordance with one embodiment of the present invention, areas of the pixel blocks that are located between two adjacent dummy lines and that are not passed through by the dummy lines define a plurality of central regions, and the quantity of the pixel blocks within each of the central regions is the same.

In accordance with one embodiment of the present invention, an area of the pixel blocks that are located between a first edge and one of the dummy lines which is nearest to the first edge and that are not passed through by the dummy lines defines a first edge region, an area of the pixel blocks that are to located between a second edge and one of the dummy lines which is nearest to the second edge and that are not passed through by the dummy lines defines a second edge region, the first edge and the second edge are two opposite edges of the active area, and the quantity of the pixel blocks within the first edge region and the quantity of the pixel blocks within the second edge region are the same.

In accordance with one embodiment of the present invention, an area of the pixel blocks that are located between a first edge and one of the dummy lines which is nearest to the first edge and that are not passed through by the dummy lines defines a first edge region, an area of the pixel blocks that are located between a second edge and one of the dummy lines which is nearest to the second edge and that are not passed through by the dummy lines defines a second edge region, the first edge and the second edge are two opposite edges of the active area, the quantity of the pixel blocks within the first edge region and the quantity of the pixel blocks within each central region are the same, and the quantity of the pixel blocks within the first edge region and the quantity of the pixel blocks within the second edge region are different.

In accordance with one embodiment of the present invention, areas of the pixel blocks that are located between two adjacent second transmission lines and that are not passed through by the second transmission lines define a plurality of central regions, and the quantity of the pixel blocks within each of the central regions is the same.

In accordance with one embodiment of the present invention, an area of the pixel blocks that are located between a first edge and one of the second to transmission lines which is nearest to the first edge and that are not passed through by the second transmission lines defines a first edge region, an area of the pixel blocks that are located between a second edge and one of the second transmission lines which is nearest to the second edge and that are not passed through by the second transmission lines defines a second edge region, the first edge and the second edge are two opposite edges of the active area, and the quantity of the pixel blocks within the first edge region and the quantity of the pixel blocks within the second edge region are the same.

In accordance with one embodiment of the present invention, an area of the pixel blocks that are located between a first edge and one of the second transmission lines which is nearest to the first edge and that are not passed through by the second transmission lines defines a first edge region, an area of the pixel blocks that are located between a second edge and one of the second transmission lines which is nearest to the second edge and that are not passed through by the second transmission lines defines a second edge region, the first edge and the second edge are two opposite edges of the active area, the quantity of the pixel blocks within the first edge region and the quantity of the pixel blocks within each central region are the same, and the quantity of the pixel blocks thin the first edge region and the quantity of the pixel blocks within the second edge region are different.

In accordance with one embodiment of the present invention, each of the first pins and second pins selectively outputs 5 voltage levels.

In accordance with one embodiment of the present invention, the first pins are corresponding to first voltage levels, and the second pins are corresponding to second voltage levels.

In summary, with the embodiments mentioned above, the borders of the display panel can be thinner by using the first and second transmission lines to transmit the second signal. The first pins and the second pins of the driver IC chip can be evenly disposed and interleaved, so that the first signal lines and the transmission lines do not cross over each other, and the capacitance coupling effect and stray capacitance can be avoided. In addition, by ensuring that the orthogonal projections of the first signal lines, the first transmission lines, the second transmission lines, and the dummy lines on the substrate do not overlap, parasitic capacitance can be avoided. Moreover, by evenly disposing the dummy lines and the second transmission lines, load imbalance in the active area of the display panel also can be avoided, so that the quality of the image of the display panel can be improved.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
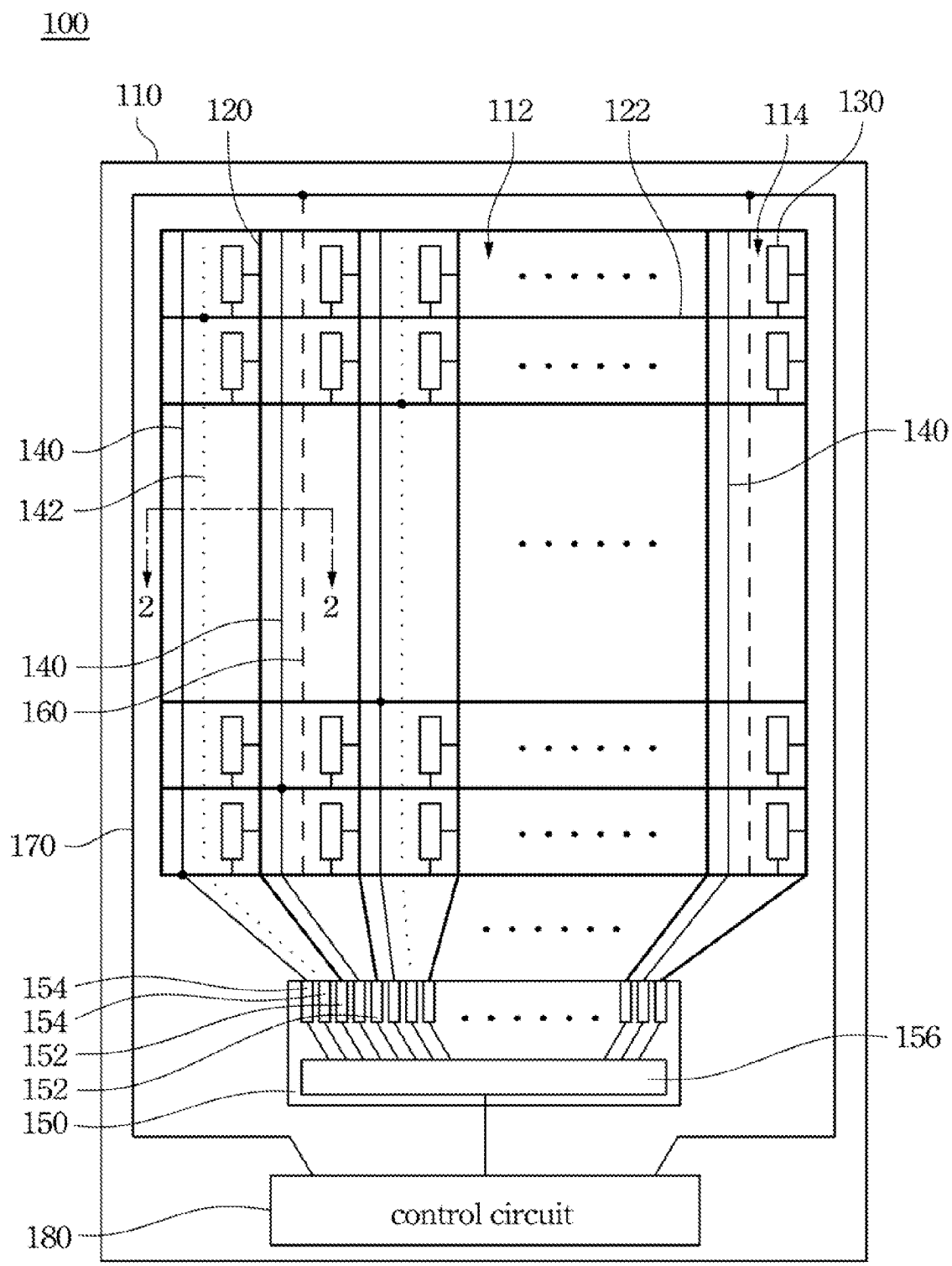
FIG. 1 is a schematic diagram of a display panel in accordance with one embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

FIG. 1 is a schematic diagram of a display panel 100 in accordance with one embodiment of the present disclosure. The display panel 100 includes a substrate 110, a plurality of first signal lines 120, a plurality of second signal lines 122, a plurality of pixel units 130, a plurality of transmission lines 140, 142, and a driver IC chip 150. It is noted that the first signal lines 120 and the second to signal lines 122 may separately be data lines and scan lines. That is, when the first signal lines 120 are data lines, the second signal lines 122 are the scan lines, and vice versa.

The substrate 110 includes an active area 112 including a plurality of pixel blocks 114. The first signal lines 120 are disposed parallel to each other on the substrate 110. The second signal lines 122 are disposed parallel to each other on the substrate 110 and crossing over the first signal lines 120 to define the pixel blocks 114. The quantity of the second signal lines 122 is more than the quantity of the first signal lines 120. The pixel units 130 are respectively disposed within the pixel blocks 114, and respectively electrically connected to the first signal lines 120 and respectively electrically connected also to the second signal lines 122. Each pixel unit 130 includes a switch (for example, a thin-film transistor), a storage capacitor and a pixel electrode (all not shown). When the switch is opened by a signal (i.e., a scan signal), the storage capacitor can be charged by a data signal with a data voltage transmitted by the data line, and continuously provide the data voltage to the pixel electrode when the switch is closed. The transmission lines 140, 142 are disposed parallel to each other on the substrate 110, crossing through two opposite sides of the active area 112, and parallel to the first signal lines 120. The driver IC chip 150 can include a plurality of first pins 152, a plurality of second pins 154, and a driver circuit 156. The first pins 152 are electrically connected to the first signal lines 120. The second pins 154 are electrically connected to the transmission lines 140, 142. The driver circuit 156 can generate a first signal and a second signal, and respectively transmit the first signal and the second signal to the first to pins 152 and the second pins 154. The first pins 152 and the second pins 154 are evenly disposed and interleaved with each other, such that the first signal lines 120 and the transmission lines 140, 142 electrically connected to the first pins 152 and the second pins 154 do not cross over each other, and the transmission lines 140, 142 can be evenly disposed on the substrate 110. In other words, by interleaving the first pins 152 and the second pins 154, the wiring lines that are used to electrically connect the first pins 152 to the first signal lines 120 and electrically connect the second pins 154 to the transmission lines 140, 142 do not cross over each other. It is noted that the transmission lines 140, 142 can be connected to the second signal lines 122 via through holes or contact plugs. In addition, the first signal and the second signal can respectively be a data signal (for supply to data lines) and a scan signal (for supply to scan lines). The data signal and the scan signal have different voltage levels. For example, the voltage level of the data signal can be −15V, 0V, and +15V, for use in representing different gray scales, and the voltage level of the scan signal can be −20V and +22V, for use in respectively turning off or turning on transistors of a row of pixel units 130.

In this embodiment, the driver IC chip 150 can be an adjustable driver IC chip. The driver IC chip 150 can determine any pin to serve as one of the first pins 152 or one of the second pins 154 by providing this pin a different signal, such as a data signal or a scan signal, through the driver circuit 156. That is, each pin of the driver IC chip 150 can selectively output a data signal or a scan signal, depending on the voltage level that is provided to the pin. For example, if the driver IC chip 150 provides a scan signal, of which the voltage level may to be −20V or +22V, to one specific pin through the driver circuit 156, then the specific pin would serve as a scan pin used to connect to the scan lines. In other words, the driver IC chip 150 can provide any pin with a different voltage level through the driver circuit 156, such that the specific pin can be used to connect to the scan lines or to the data lines depending on actual requirements. For example, five voltage levels can be provided, such as −15V, 0V, +15V, −20V, +22V.

The following table shows an example of a pin allocation of the driver IC chip 150.

| Pixels | Pin Allocation | | | | | | | | | | | | | | | | | | | | | |
|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| 10 × 8 | G | S | G | S | G | G | S | G | S | G | S | G | G | S | G | S | G | S | — | — | — | — |
| 12 × 8 | G | G | S | G | S | G | G | S | G | S | G | G | S | G | S | G | G | S | G | S | — | — |
| 14 × 8 | G | G | S | G | G | S | G | S | G | G | S | G | G | S | G | S | G | G | S | G | G | S |

In the table above, G indicates a scan pin and S indicates a data pin. For example, when the size of the display panel is 10×8, pin 1 is a scan pin, pin 2 is a data pin, and so on.

Therefore, by utilizing this ability of the driver IC chip 150 to perform control so that any specific pin can serve as a data pin or a scan pin based on actual requirements, the first pins 152 and the second pins 154 can be evenly disposed and interleaved with each other, such that the first signal lines 120 and the transmission lines 140, 142 do not cross over each other (that is, the wiring lines that are used to electrically connect the first pins 152 to the first to signal lines 120 and electrically connect the second pins 154 to the transmission lines 140, 142 do not cross over each other), and the transmission lines 140, 142 are evenly disposed on the substrate 110.

With such a configuration of the transmission lines 140, 142, the border of the display panel 100 can become thinner. Moreover, by the pin allocation of the driver IC chip 150 mentioned above, the first signal lines 120 and the transmission lines 140, 142 do not cross over each other, such that the stray capacitance and the capacitance coupling effect can be avoided. In addition, again due to the pin allocation of the driver IC chip 150, the transmission lines 140, 142 are evenly disposed on the substrate 110, such that uneven brightness in an image caused by load imbalance of the active area 112 can be avoided.

However, even with the even disposition of the transmission lines 140, 142, the load imbalance problem of the active area 112 may still occur due to the number of the transmission lines 140 passing through each pixel block 114 being different from each other. Hence, dummy lines 160 can be disposed to overcome such a problem in some embodiments.

In one embodiment of the present disclosure, the display panel 100 further includes a plurality of dummy lines 160. The dummy lines 160 are evenly disposed on the substrate 110, parallel to the transmission lines 140, 142, and crossing through two opposite sides of the active area 112. In this embodiment, the transmission lines 140, 142 can be divided into a plurality of first transmission lines 140 and a plurality of second transmission lines 142. The quantity of the first transmission lines 140 passing through each of the pixel blocks 114 is the same. Moreover, one of the second transmission lines 142 or one of the dummy lines 160 passes through each of the pixel blocks 114. In other words, an equal quantity of the first transmission lines 140 are disposed on each column of pixel blocks 114, and due to the fact that there is an insufficient quantity of the second transmission lines 142 to be disposed on each column of pixel blocks 114, the dummy lines 160 are disposed on the columns of pixel blocks 114 not having the second transmission lines 142 passed therethrough. As a result, uneven brightness in images caused by load imbalance of the active area 112 can be avoided.

In one embodiment of the present disclosure, the display panel 100 further includes a periphery circuit 170 and a control circuit 180. The periphery circuit 170 is disposed on the substrate 110 and around the active area 112, and is configured to electrically connect all the dummy lines 160 to each other. The control circuit 180 is electrically connected to the periphery circuit 170 and the driver IC chip 150, and is configured to provide a turn-off voltage level to the periphery circuit 170 and to drive the driver IC chip 150. It is noted that the drive circuit 180 can be implemented by hardware, software, or partly by hardware and partly by software. In addition, the turn-off voltage level can be the voltage level in a scan signal used to turn off the switch of the pixel unit 130, and for example, the turn-off voltage level can be −20V.

Through providing the turn-off voltage level to all the dummy lines 160, the dummy lines 160 can act like the first and second transmission lines 140, 142 provided with the turn-off voltage level, such that the display panel 100 can avoid the uneven brightness problem in an image caused by load imbalance. In addition, by connecting all the dummy lines 160 to the periphery circuit 170, the number of pins of the driver IC chip 150 can be minimized, and the cost and complexity of the driver IC chip 150 can be reduced.

Figure 2:
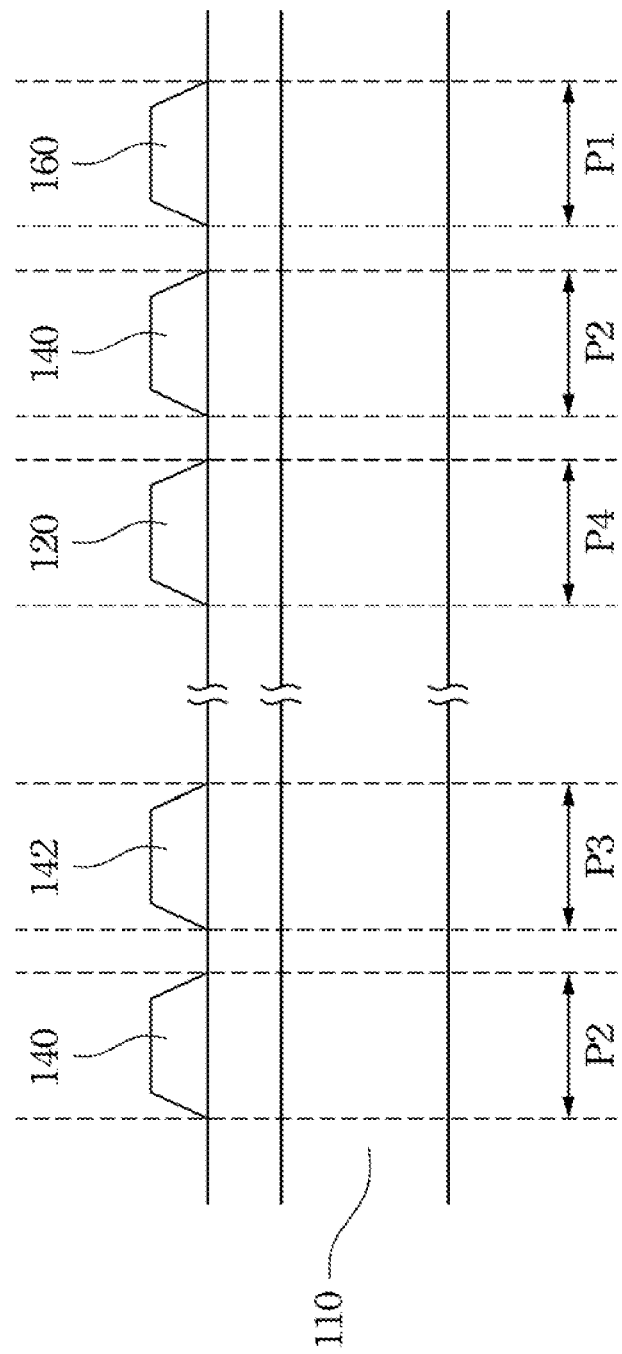
FIG. 2 is a sectional view of the display panel taken along line 2-2 in FIG. 1.

FIG. 2 is a sectional view of the display panel 100 taken along line 2-2 in FIG. 1. The orthogonal projection of the dummy lines 160 on the substrate 110 (labeled as P1), the orthogonal projection of the first transmission lines 140 on the substrate 110 (labeled as P2), the orthogonal projection of the second transmission lines 142 on the substrate 110 (labeled as P3), and the orthogonal projection of the first signal lines 120 on the substrate 110 (labeled as P4) are not overlapped. With such a configuration, parasitic capacitance and capacitance coupling effect can be avoided. It is noted that the configuration in FIG. 2 is just an example, and the first signal lines 120, the first transmission lines 140, the second transmission lines 142, and the dummy lines 160 can be disposed on different circuit layers determined on the basis of actual requirements, and the present invention is not limited by the embodiment shown in FIG. 2.

In one embodiment of the present disclosure, due to the fact that the second transmission lines 142 are configured to transmit the second signal while the dummy lines 160 do not transmit any signal, the second transmission lines 142 and the dummy lines 160 can be evenly disposed on the active area 112, so as to avoid uneven brightness in an image caused by load imbalance of the active area 112.

To better explain such disposition, reference will be made to FIG. 3 to FIG. 6, in which different embodiments are illustrated.

Figure 3:
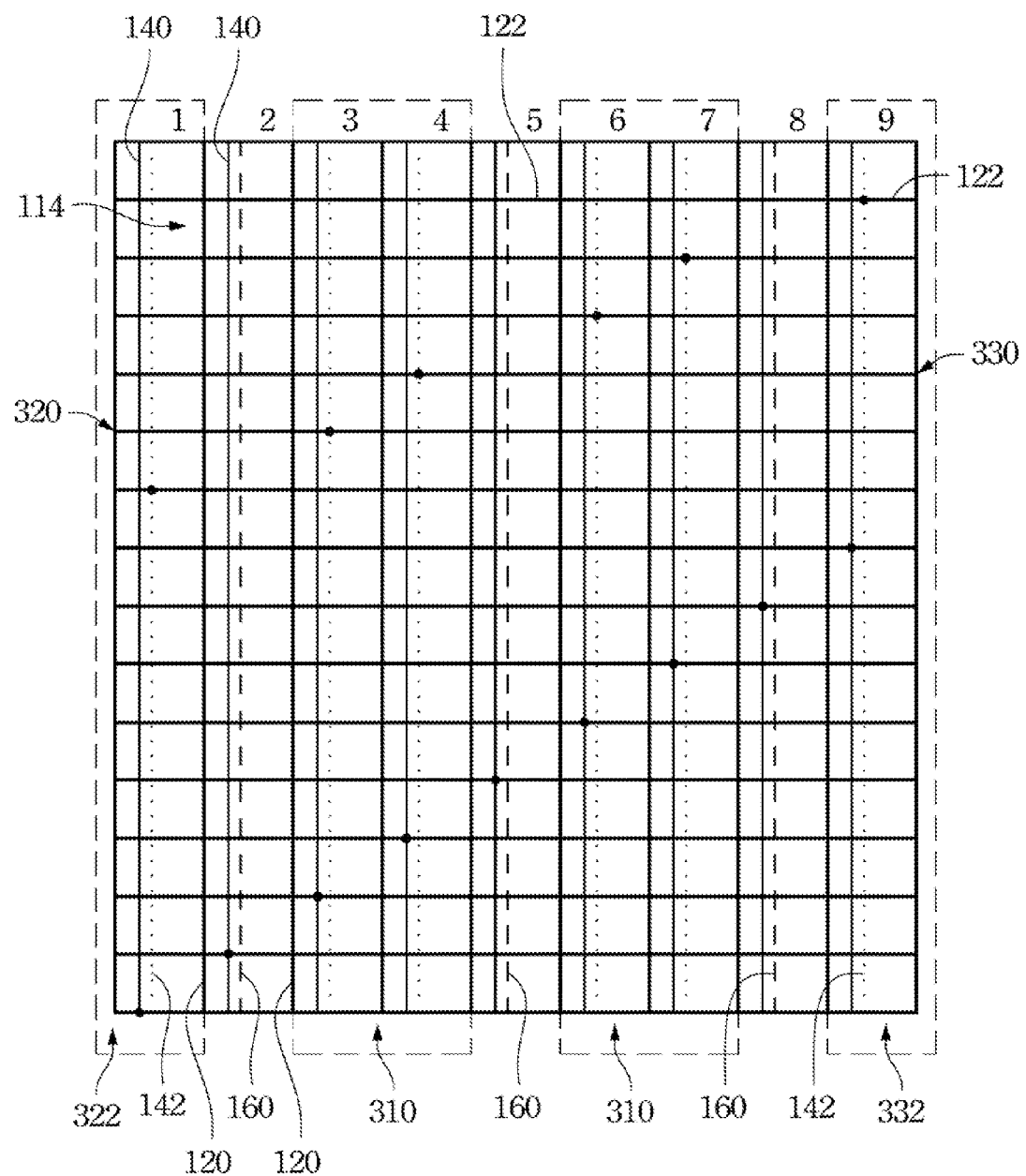
FIG. 3 is a schematic diagram illustrating the disposition of second transmission lines and dummy lines in accordance with one embodiment of the present disclosure.

FIG. 3 is a schematic diagram illustrating the disposition of the second transmission lines 142 and the dummy lines 160 in accordance with one embodiment of the present disclosure. The active area 112 is a 15×9 array built with the pixel blocks 114. The active area 112 has a first edge 320 and a second edge 330. The first edge 320 and the second edge 330 are opposite to each other, and parallel to the dummy lines 160. In this embodiment, corresponding to the quantity of the columns of the pixel blocks 114, the quantity of the first transmission lines 140 is 9, and the first transmission lines 140 are connected to some of the second signal lines 122. The second transmission lines 142 are connected to the rest of the second signal lines 122, that is, the second signal lines 122 which are not connected with the first transmission lines 140, and therefore the quantity of the second transmission lines 142 is 6. The dummy lines 160 can be disposed on column 2, 5, and 8 of the pixel blocks 114, and the second transmission lines 142 can be correspondingly disposed on column 1, 3, 4, 6, 7, and 9 of the pixel blocks 114. With such a configuration, the load imbalance problem of the active area 112 can be avoided by evenly disposing the second transmission lines 142 and dummy lines 160.

In this embodiment, the areas of the pixel blocks 114 that are located between two adjacent dummy lines 160 and that are not passed through by the dummy lines 160 define a plurality of central regions 310. By evenly disposing the second transmission lines 142 and dummy lines 160, the quantity of the pixel blocks 114 within each central region 310 is the same. In this embodiment, the quantity of the pixel blocks 114 within each central region 310 is 30. With to such a configuration, the load imbalance problem of the active area 112 can be avoided.

In this embodiment, the area of the pixel blocks 114 that are located between the first edge 320 and one of the dummy lines 160 which is nearest to the first edge 320 and that are not passed through by the dummy lines 160 defines a first edge region 322, and the area of the pixel blocks 114 that are located between the second edge 330 and one of the dummy lines 160 which is nearest to the second edge 330 and that are not passed through by the dummy lines 160 defines a second edge region 332. By evenly disposing the second transmission lines 142 and dummy lines 160, the quantity of the pixel blocks 114 within the first edge region 322 and that within the second edge region 332 are the same. In this embodiment, both of the quantities of the pixel blocks 114 within the first edge region 322 and the second edge region 332 are 15. It should be noted that although the quantity of the pixel blocks 114 within each of the first edge region 322 and the second edge region 332 is different from the quantity of the pixel blocks 114 within the central regions 310 due to the fact that uneven brightness in the first edge region 322 and the second edge region 332 is not easily visually perceivable, any negative effect that may be caused by such differences in quantities of the pixel blocks 114 in these regions is negligible. In addition, in another embodiment, the quantity of the pixel blocks 114 within each of the first edge region 322 and the second edge region 332 can be the same as the quantity of the pixel blocks 114 within the central regions 310.

Figure 4:
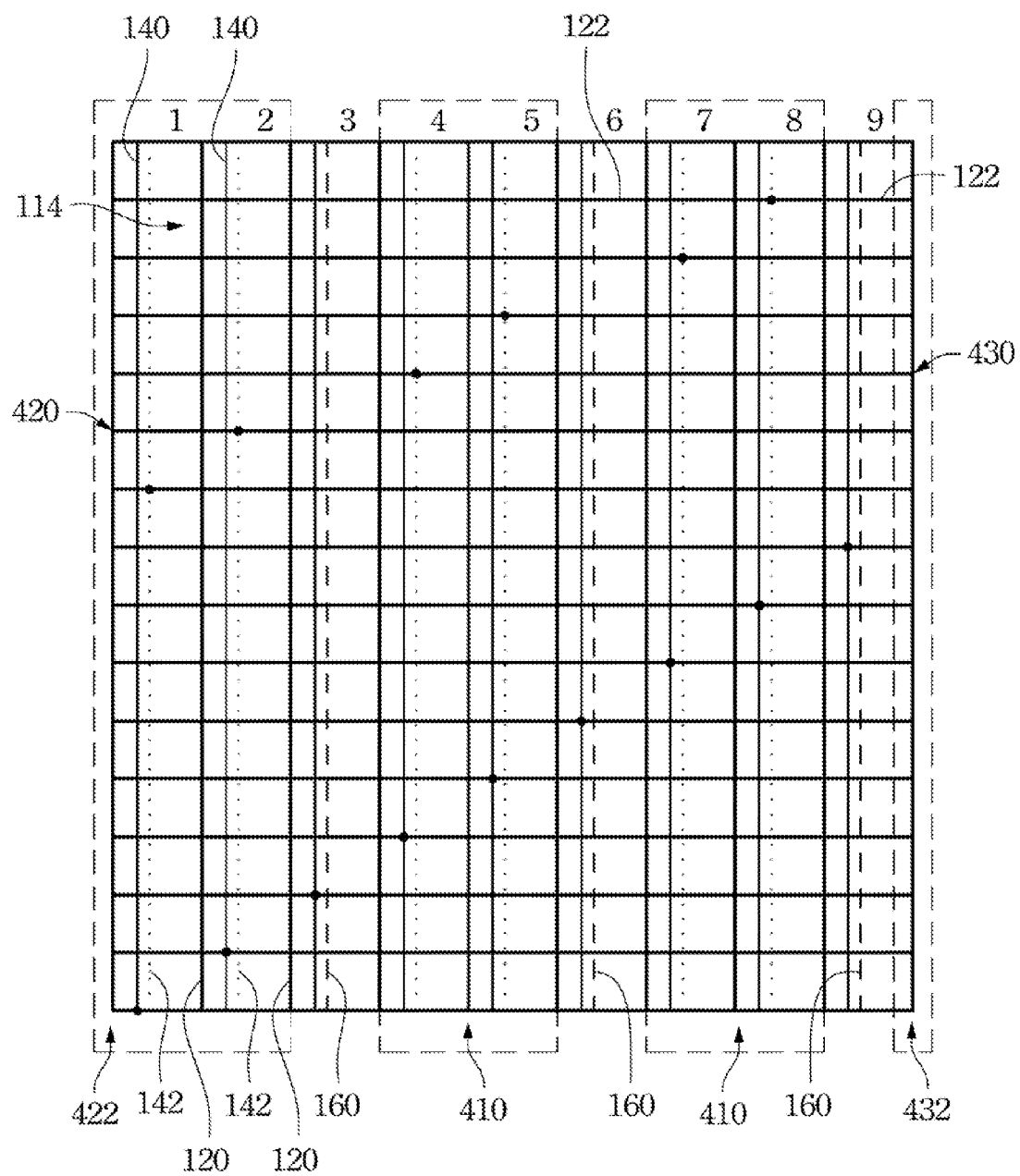
FIG. 4 is a schematic diagram illustrating the disposition of the second transmission lines and the dummy lines in accordance with one embodiment of the present disclosure.

FIG. 4 is a schematic diagram illustrating the disposition of the second to transmission lines 142 and the dummy lines 160 in accordance with one embodiment of the present disclosure. In this embodiment, the active area 112 is also a 15×9 array built with the pixel blocks 114, the same as the embodiment in FIG. 3, and therefore, aspects of this embodiment that are similar to those of the previous embodiment will not be repeated herein. The active area 112 has a first edge 420 and a second edge 430. In this embodiment, the dummy lines 160 can be disposed on column 3, 6, and 9 of the pixel blocks 114, and the second transmission lines 142 can be correspondingly disposed on column 1, 2, 4, 5, 7, and 8 of the pixel blocks 114.

The areas of pixel blocks 114 that are located between two adjacent dummy lines 160 and that are not passed through by the dummy lines 160 define a plurality of central regions 410. In this embodiment, the quantity of the pixel blocks 114 within each central region 410 is 30.

The area of the pixel blocks 114 that are located between the first edge 420 and one of the dummy lines 160 which is nearest to the first edge 420 and that are not be passed by the dummy lines 160 defines a first edge region 422, and the area of the pixel blocks 114 that are located between the second edge 430 and one of the dummy lines 160 which is nearest to the second edge 430 and that are not passed through by the dummy lines 160 defines a second edge region 432. In this embodiment, the quantity of the pixel blocks 114 within the first edge region 422 is 30, and the quantity of the pixel blocks 114 within the second edge region 432 is 0. It should be noted that although the quantity of the pixel blocks 114 within the first edge region 422 is the same as the quantity of the pixel blocks 114 within the central regions 410, while is different from the quantity of the pixel blocks 114 within the second edge region 432, due to the fact that uneven brightness in the first edge region 422 and the second edge region 432 is not easily visually perceivable, any negative effect that may be caused by such differences in quantities of the pixel blocks 114 in these regions is negligible.

In the embodiments described above in FIG. 3 and FIG. 4, the active area 112 is divided by the dummy lines 160. However, in the following embodiments in FIG. 5 and FIG. 6, the active area 112 will be divided by the second transmission lines 142.

Figure 5:
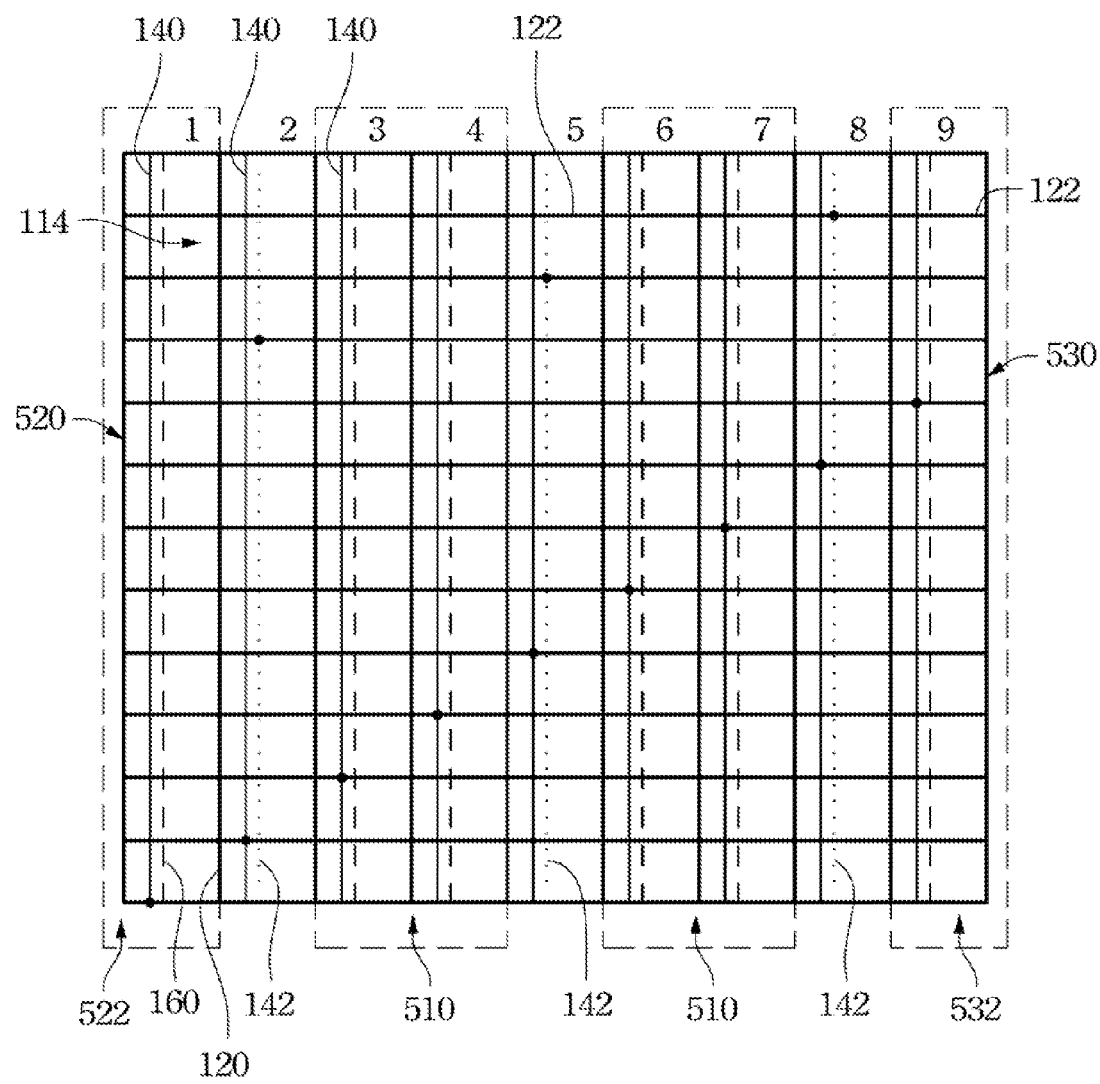
FIG. 5 is a schematic diagram illustrating the disposition of the second transmission lines and the dummy lines in accordance with one embodiment of the present disclosure.

FIG. 5 is a diagram illustrating the disposition of the second transmission lines 142 and the dummy lines 160 in accordance with one embodiment of the present disclosure. The active area 112 is a 12×9 array built with the pixel blocks 114. The active area 112 has a first edge 520 and a second edge 530. The first edge 520 and the second edge 530 are opposite to each other, and parallel to the dummy lines 160. In this embodiment, corresponding to the quantity of the columns of the pixel blocks 114, the quantity of the first transmission lines 140 is 9, and the first transmission lines 140 are connected to some of the second signal lines 122. The second transmission lines 142 are connected to the rest of the second signal lines 122, that is, the second signal lines 122 which are not connected with the first transmission lines 140, and therefore the quantity of the second transmission lines 142 is 3. The second transmission lines 142 can be disposed on column 2, 5, and 8 of the pixel blocks 114, and the dummy lines 160 can be correspondingly disposed on column 1, 3, 4, 6, 7, and 9 of the pixel blocks 114. With such a configuration, the load imbalance problem of the active area 112 can be avoided by evenly disposing the second transmission lines 142 and dummy lines 160.

In this embodiment, the areas of the pixel blocks 114 that are located between two adjacent second transmission lines 142 and that are not passed through by the second transmission lines 142 define a plurality of central regions 510. By evenly disposing the second transmission lines 142 and the dummy lines 160, the quantity of the pixel blocks 114 within each central region 510 is the same. In this embodiment, the quantity of the pixel blocks 114 within each central region 510 is 24. With such a configuration, the load imbalance problem of the active area 112 can be avoided.

In this embodiment, the area of the pixel blocks 114 that are located between the first edge 520 and one of the second transmission lines 142 which is nearest to the first edge 520 and that are not passed through by the second transmission lines 142 defines a first edge region 522, and the area of the pixel blocks 114 that are located between the second edge 530 and one of the second transmission lines 142 which is nearest to the second edge 530 and that are not passed through by the second transmission lines 142 defines a second edge region 532. By evenly disposing the second transmission lines 142 and dummy lines 160, the quantity of the pixel blocks 114 within the first edge region 522 and that within the second edge region 532 are the same. In this embodiment, both of the quantities of the pixel blocks 114 within the first edge region 522 and the second edge region 532 are 12. It should be noted that although the quantity of the pixel blocks 114 within each of the first edge region 522 and the second edge region 532 is different from the quantity of the pixel blocks 114 within each of the central regions 510, due to the fact that uneven brightness in the first edge region 522 and the second edge region 532 is not easily visually perceivable, any negative effect that may be caused by such differences in quantities of the pixel blocks 114 in these regions is negligible. In addition, in another embodiment, the quantity of the pixel blocks 114 within each of the first edge region 522 and the second edge region 532 can be the same as the quantity of the pixel blocks 114 within each of the central regions 510.

Figure 6:
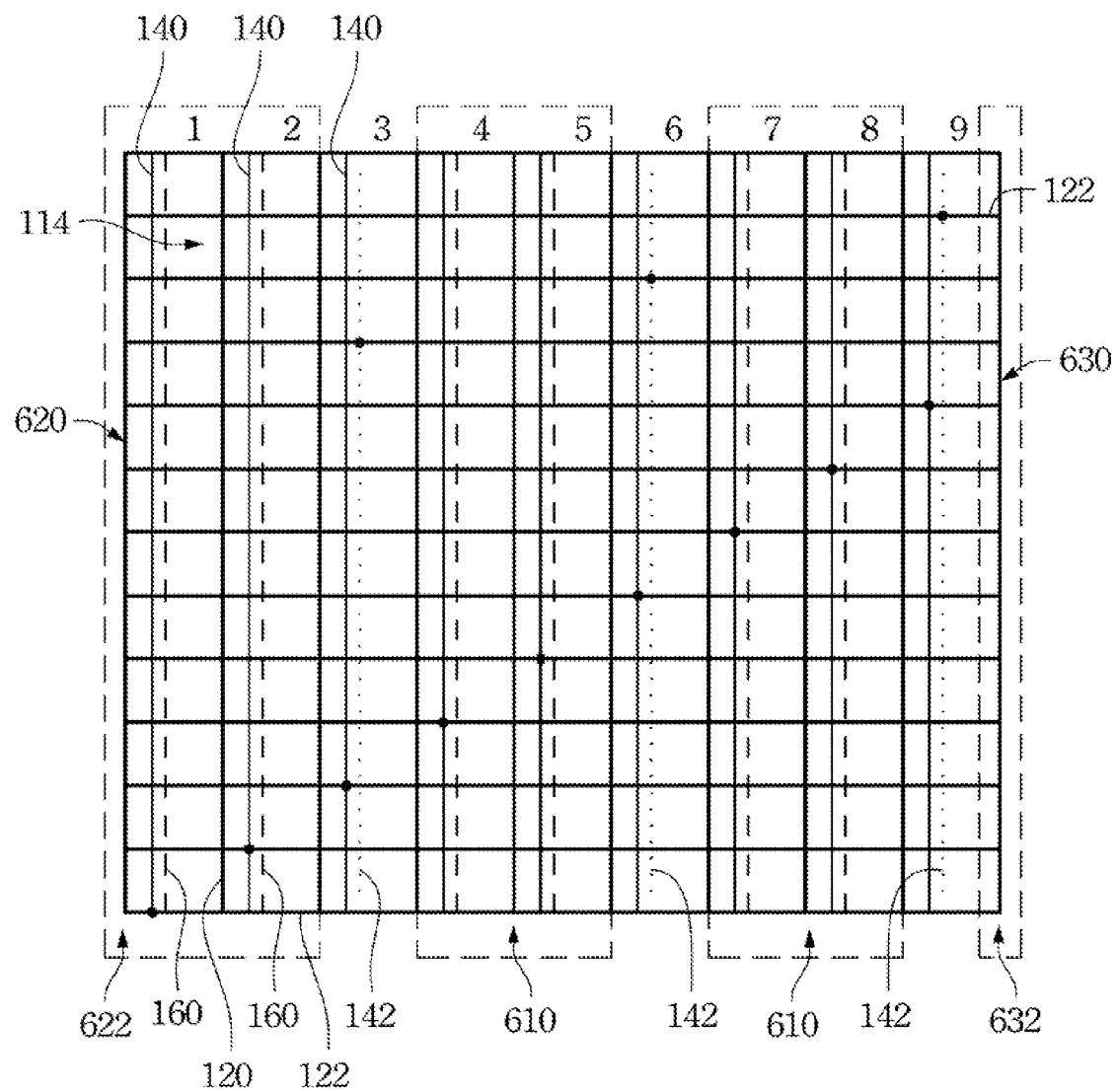
FIG. 6 is a schematic diagram illustrating the disposition of the second transmission lines and the dummy lines in accordance with one embodiment of the present disclosure.

FIG. 6 is a diagram illustrating the disposition of the second transmission lines 142 and the dummy lines 160 in accordance with one embodiment of the present disclosure. In this embodiment, the active area 112 is also a 12×9 array built with the pixel blocks 114, the same as the embodiment in FIG. 5, and therefore, aspects of this embodiment that are similar to those of the previous embodiment will not be repeated herein. The active area 112 has a first edge 620 and a second edge 630. In this embodiment, the second transmission lines 142 can be disposed on column 3, 6, and 9 of the pixel blocks 114, and the dummy lines 160 can be correspondingly disposed on column 1, 2, 4, 5, 7, and 8 of the pixel blocks 114.

The areas of the pixel blocks 114 that are located between two adjacent second transmission lines 142 and that are not be passed through by the second transmission lines 142 are referring to as central regions 610. In this embodiment, the quantity of the pixel blocks 114 within each central region 610 is 24.

The area of the pixel blocks 114 that are located between the first edge to 620 and one of the second transmission lines 142 which is nearest to the first edge 620 and that are not passed through by the second transmission lines 142 defines a first edge region 622, and the area of the pixel blocks 114 that are located between the second edge 630 and one of the second transmission lines 142 which is nearest to the second edge 630 and that are not passed through by the second transmission lines 142 defines a second edge region 632. In this embodiment, the quantity of the pixel blocks 114 within the first edge region 622 is 24, and the quantity of the pixel blocks 114 within the second edge region 632 is 0. It should be noted that although the quantity of the pixel blocks 114 within the first edge region 622 is the same as the quantity of the pixel blocks 114 within each of the central regions 610, and is different from the quantity of the pixel blocks 114 within the second edge region 632, due to the fact that uneven brightness in the first edge region 622 and the second edge region 632 is not easily visually perceivable, any negative effect that may be caused by such differences in quantities of the pixel blocks 114 in these regions is negligible.

In accordance with the embodiments above in FIGS. 3, 4, 5, and 6, it should be noted that the second transmission lines 142 and the dummy lines 160 are evenly disposed to make the quantities of pixel blocks 114 within the central regions 310, 410, 510, 610, which are defined by the dummy lines 160 or the second transmission lines 142, the same. Moreover, while the pixel blocks 114 can not be passed through by the dummy lines 160 and the second transmission lines 142 evenly, the pixel blocks 114 associated with such unevenness can be arranged within the first and second edge regions 322, 332, to 422, 432, 522, 532, 622, 632 of the active area 112, such that the areas of uneven brightness of the active area 112 are not visually perceivable. It should be noted that the embodiments above in FIGS. 3, 4, 5, and 6 are used to explain the idea of disposing the dummy lines 160 and the second transmission lines 142, and this invention is not limited by these embodiments. In addition, the first edge 320, 420, 520, 620 and the second edge 330, 430, 530, 630 are two opposite edges of the active area 112, parallel to the dummy lines 160, and are not limited by the embodiments in FIGS. 3, 4, 5, and 6.

In summary, the borders of the display panel 100 can be made thinner by using the first and second transmission lines 140, 142 to transmit the second signal. However, the first and second transmission lines 140, 142 may cross over each other, causing the stray capacitance, and moreover, the first and second transmission lines 140, 142 may cause the problem of load imbalance of the active area 112. Therefore, the first pins 152 and the second pins 154 of the driver IC chip 150 can be evenly disposed and interleaved, so that the second transmission lines 142 can be evenly disposed on the active area 112, and the capacitance coupling effect caused by stray capacitance can be avoided. Accordingly, by evenly disposing the second transmission lines 142 and the dummy lines 160 on the active area 112, the uneven brightness in an image caused by load imbalance of the active area 112 can also be avoided. Moreover, by ensuring that the orthogonal projections of the first signal lines 120, the first transmission lines 140, the second transmission lines 142, and the dummy lines 160 on the substrate 110 do not overlap, parasitic capacitance can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel comprising:
   a substrate comprising an active area;
   a plurality of first signal lines disposed parallel to each other on the substrate and extending in a first direction;
   a plurality of second signal lines disposed parallel to each other on the substrate and extending in a second direction that is substantially perpendicular to the first direction to intersect the first signal lines, wherein there are more of the second signal lines than the first signal lines, and the intersection of the first signal lines with the second signal lines defines a plurality of pixel blocks;
   a plurality of pixel units respectively disposed within the pixel blocks, and respectively electrically connected to the first signal lines and respectively electrically connected to the second signal lines;
   a plurality of first transmission lines disposed parallel to each other on the substrate, respectively electrically connected to some of the second signal lines, crossing through two opposite sides of the active area, and parallel to the first signal lines;

a plurality of second transmission lines disposed parallel to each other on the substrate, respectively electrically connected to the rest of the second signal lines that the first transmission lines are not electrically connected to, crossing through two opposite sides of the active area, and parallel to the first signal lines;

a plurality of dummy lines evenly disposed on the substrate, parallel to the first transmission lines and the second transmission lines, the dummy lines extending through the two opposite sides of the active area; and a driver IC chip comprising:
- a plurality of first pins electrically connected to the first signal lines;
- a plurality of second pins electrically connected to the first transmission lines and the second transmission lines; and
- a driver circuit configured to generate a first signal and a second signal and to respectively transmit the first signal and the second signal to the first pins and the second pins;

wherein the first pins and the second pins are evenly disposed and interleaved with each other, such that the first signal lines, the first transmission lines and the second transmission lines electrically connected to the first pins and the second pins do not cross over each other, and the first transmission lines and the second transmission lines are evenly disposed on the substrate;

wherein the intersection of the first signal lines with the second signal lines forms an array of the pixel blocks, each of the pixel blocks being defined by one of the first signal lines and an immediately adjacent one of the second signal lines at corners of the array of the pixel blocks, an immediately adjacent two of either the first signal lines or the second signal lines and an immediately adjacent one of either the first signal lines or the second signal lines at outer areas of the array of the pixel blocks except at the corners thereof, and an immediately adjacent two of the first signal lines and an immediately adjacent two of the second signal lines at all other areas of the array of the pixel blocks;

wherein the array of the pixel blocks comprises a plurality of columns of pixel blocks extending in the first direction, one of the first transmission lines and one of the second transmission lines passes through each of select columns of the pixel blocks, and one of the first transmission lines and one of the dummy lines passes through each of remaining columns of the pixel blocks.

2. The display panel as claimed in claim 1, wherein the second signal transmitted to the second pins, which are electrically connected to the first transmission lines and the second transmission lines, by the driver circuit of the driver IC chip is a scan signal that is selectively a positive value and a negative value, the negative value corresponding to a turn-off voltage level;

wherein the display panel further comprises:
- a periphery circuit disposed on the substrate and around the active area, and configured to electrically connect the dummy lines to each other; and
- a control circuit electrically connected to the periphery circuit and the driver IC chip, and configured to provide the turn-off voltage level to the periphery circuit, and to drive the driver IC chip;

wherein providing the turn-off voltage level to the periphery circuit by the control circuit results in providing the turn-off voltage level to all of the dummy lines.

3. The display panel as claimed in claim 1, wherein orthogonal projections of the dummy lines, the first transmission lines, the second transmission lines, and the first signal lines on the substrate are not overlapped.

4. The display panel as claimed in claim 1, wherein areas of the pixel blocks that are located between two adjacent dummy lines and that are not passed through by the dummy lines define a plurality of central regions, and a quantity of the pixel blocks within each of the central regions are identical.

5. The display panel as claimed in claim 4, wherein an area of the pixel blocks that are located between a first edge and one of the dummy lines which is nearest to the first edge and that are not passed through by the dummy lines defines a first edge region,
- an area of the pixel blocks that are located between a second edge and one of the dummy lines which is nearest to the second edge and that are not passed through by the dummy lines defines a second edge region,
- the first edge and the second edge are two opposite edges of the active area, and
- a quantity of the pixel blocks within the first edge region and a quantity of the pixel blocks within the second edge region are identical.

6. The display panel as claimed in claim 4, wherein an area of the pixel blocks that are located between a first edge and one of the dummy lines which is nearest to the first edge and that are not passed through by the dummy lines defines a first edge region,
- an area of the pixel blocks that are located between a second edge and one of the dummy lines which is nearest to the second edge and that are not passed through by the dummy lines defines a second edge region,
- the first edge and the second edge are two opposite edges of the active area,
- a quantity of the pixel blocks within the first edge region and a quantity of the pixel blocks within each central region are identical, and
- the quantity of the pixel blocks within the first edge region and a quantity of the pixel blocks within the second edge region are different.

7. The display panel as claimed in claim 4, wherein areas of the pixel blocks that are located between two adjacent second transmission lines and that are not passed through by the second transmission lines define a plurality of central regions, and a quantity of the pixel blocks within each of the central regions are identical.

8. The display panel as claimed in claim 7, wherein an area of the pixel blocks that are located between a first edge and one of the second transmission lines which is nearest to the first edge and that are not passed through by the second transmission lines defines a first edge region,
- an area of the pixel blocks that are located between a second edge and one of the second transmission lines which is nearest to the second edge and that are not passed through by the second transmission lines defines a second edge region,
- the first edge and the second edge are two opposite edges of the active area, and
- a quantity of the pixel blocks within the first edge region and a quantity of the pixel blocks within the second edge region are identical.

9. The display panel as claimed in claim 8, wherein an area of the pixel blocks that are located between a first edge and one of the second transmission lines which is nearest to the first edge and that are not passed through by the second transmission lines defines a first edge region,
- an area of the pixel blocks that are located between a second edge and one of the second transmission lines which is nearest to the second edge and that are not passed through by the second transmission lines defines a second edge region,
- the first edge and the second edge are two opposite edges of the active area,
- a quantity of the pixel blocks within the first edge region and a quantity of the pixel blocks within each central region are identical, and
- the quantity of the pixel blocks within the first edge region and a quantity of the pixel blocks within the second edge region are different.

10. The display panel as claimed in claim 1, wherein the first pins are corresponding to first voltage levels, and the second pins are corresponding to second voltage levels.

* * * * *